United States Patent [19]

Prusak et al.

[11] Patent Number: 5,180,150
[45] Date of Patent: Jan. 19, 1993

[54] APPARATUS FOR PROVIDING CONSISTENT REGISTRATION OF SEMICONDUCTOR WAFERS

[75] Inventors: Joseph P. Prusak, Huntington; Anthony Bassaro, Bethel, both of Conn.

[73] Assignee: Hughes Danbury Optical Systems, Inc., Danbury, Conn.

[21] Appl. No.: 825,520

[22] Filed: Jan. 24, 1992

[51] Int. Cl.⁵ .............................................. B25B 1/20
[52] U.S. Cl. .............................. 269/254 R; 269/305; 269/903
[58] Field of Search ........ 204/297 R, 297 W, 298 CS, 204/298 WH, 192.33; 361/399, 413; 357/74, 79; 174/52.4; 269/903, 254 R, 309, 303, 305; 29/271

[56] References Cited

U.S. PATENT DOCUMENTS

| | | | |
|---|---|---|---|
| 4,582,309 | 4/1986 | Moxon et al. | 269/903 |
| 4,703,920 | 11/1987 | Grabbe et al. | 269/903 |
| 4,970,772 | 11/1990 | Steere | 29/271 |
| 4,971,676 | 11/1990 | Doue et al. | 269/903 |

FOREIGN PATENT DOCUMENTS 55-148433  11/1980  Japan .................................. 269/903

OTHER PUBLICATIONS

IBM Technical Disclosure Bulletin, "Wafer-Source Boat for Capsule Diffusion", Marsh et al., Nov., 1970.

Primary Examiner—Robert C. Watson
Attorney, Agent, or Firm—W. K. Denson-Low; R. A. Hays; M. W. Sales

[57] ABSTRACT

An apparatus (10) for providing a consistent registration of a semiconductor wafer undergoing process work includes a platen (38) upon which a surround (14) is registered. The surround registers to the platen (38) by matching two pins (42), (40) that protrude from the platen (38) to a hole (44) and a notch (46) in the surround (14), respectively. A first registration surface (16) for registering a flat (20) of a semiconductor wafer (12) is permanently mounted to the surround (14). A second registration surface (18) for registering a point (24) on the circumference of the semiconductor wafer (12) is permanently mounted to the surround (14). A third, adjustable registration surface (26) also registers to a point (28) on the circumference of the wafer (12). This third registration surface (26) is springloaded to accommodate for slight diameter variations in successively processed semiconductor wafers, and to provide a force to hold the wafer (12) in place.

22 Claims, 1 Drawing Sheet

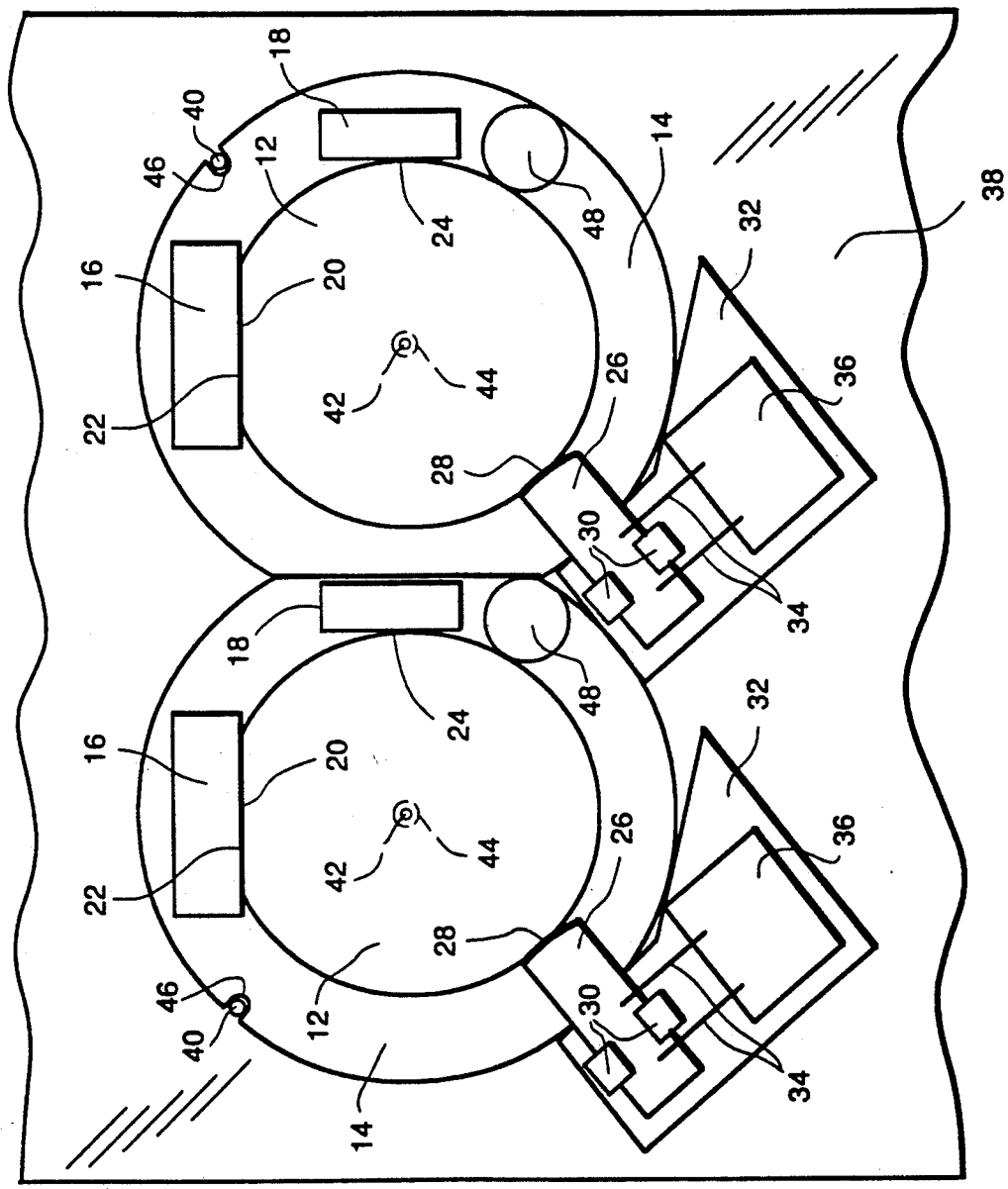

APPARATUS FOR PROVIDING CONSISTENT REGISTRATION OF SEMICONDUCTOR WAFERS

BACKGROUND OF THE INVENTION

1. Field of the Invention

The present invention relates to the registration of semiconductor wafers undergoing metrology and/or etching processes and, more particularly, to an apparatus that provides consistent registration of semiconductor wafers in order to correlate thinning and etching processes with metrology process data.

2. Description of the Prior Art

The process of measuring the thickness of an outer material layer of a semiconductor wafer is known as wafer surface metrology. During such a metrology process, a semiconductor wafer is mechanically registered to a platform of a thickness measuring instrument. This instrument generates a map that indicates an outer layer thickness over an entire surface of the wafer. The outer layer thickness map generated from this metrology process is often used in other processes that thin or etch the measured outer layer of the wafer to a desired thickness or in a desired location, respectively. These outer layer thinning and etching processes both include some type of tool that is directed onto the surface of the wafer. This tool must be properly positioned along the wafer surface to ensure that the thinning or etching process is performed at the correct location on the wafer surface. To ensure this proper wafer registration an accurate correlation between the outer layer thickness map and the position of the wafer with respect to the thinning or etching tool is required.

The current approach for correlating outer layer thickness map data with thinning or etching instrument wafer registration begins by marking the wafer with a set of alignment fiducials during the metrology process. The wafer is then placed on a larger diameter wafer which serves as a surround. The surround is made of the same material as the wafer undergoing work to maintain a consistent reaction in the thinning and etching processes along the wafer edge. The flat of the fiducialized wafer is abutted to a flat of a registration surface of like wafer material that is taped to the surface of the surround, thereby registering the wafer in one direction. The wafer metrology fiducials are then visually aligned with a corresponding set of scribe marks on an aluminum holding plate, or platen, of the instrument. Once aligned, two additional pieces of like wafer material are abutted against the wafer and taped to the surround to maintain the wafer position. The surround is then taped to the platen and the thinning or etching process may begin.

It is easily seen that the above described correlated registration procedure is time consuming and prone to human error. It is therefore desirable to accelerate this registration procedure while eliminating the potential for human error.

SUMMARY OF THE INVENTION

The present invention contemplates an apparatus that provides consistent registration of semiconductor wafers and provides correlation between thinning an etching processes and metrology process data. Such an apparatus consists of a large diameter wafer, that serves as a surround, upon which two permanently fixed registration surfaces are mounted. A first fixed registration surface is positioned such that the flat of a wafer undergoing process work will be abutted against a flat of the first registration surface. A second fixed registration surface provides a point contact along the circumference of the process wafer at an angle of about 90° from the flat of the process wafer. A third, adjustable registration surface is point contacted along the circumference of the process wafer at an angle of about −120° from the process wafer flat. This third registration surface is springloaded to accommodate slight diameter variations between successively processed wafers, and to provide a force to hold the wafer in place during processing.

The surround is registered to a platen by means of two pins that protrude from the platen. One pin is matched to a hole in the body of the surround while a second pin aligns with a notch in the surround diameter. The notch is used instead of another hole to accommodate for thermal growth in the surround during processing.

The apparatus as described above is used in thinning, etching, and metrology processes, among others, and provides consistent registration of semiconductor wafers undergoing process work regardless of diameter variations between successively processed wafers. Furthermore, this apparatus decreases the registration time associated with the tedious visual alignment procedure of the prior art, while eliminating the potential for human error.

A primary objective of the present invention is to provide an apparatus that provides consistent registration of semiconductor wafers.

Another objective of the present invention is to provide an apparatus that can accurately correlate metrology process data to wafer registration in thinning and etching process instruments.

Another objective of the present invention is to provide an apparatus that eliminates human error during wafer registration procedures in thinning and etching processes.

Another objective of the present invention is to provide an apparatus that decreases wafer registration time as compared to prior art registration procedures.

DESCRIPTION OF THE DRAWING

FIG. 1 is a top view of an apparatus embodying the principles of the present invention.

DETAILED DESCRIPTION OF THE PRESENT INVENTION

Referring to FIG. 1, there is shown an apparatus 10 that provides consistent registration for two 100 mm diameter semiconductor wafers 12. It should be noted, however, that although this apparatus 10 accommodates two 100 mm semiconductor wafers, this accommodation is just a duplication of the operation of the present invention. Thus, the following description will detail only a single portion of the duplicated present invention as shown in FIG. 1, although the entire apparatus 10 will be numerically identified.

The apparatus 10, as shown in FIG. 1, includes a surround 14 upon which a wafer 12 is placed. The surround 14 has a diameter that is larger than the diameter of the wafer 12. A pair of rectangular registration surfaces 16, 18, of a thickness approximately the same as the wafer 12, are fixedly mounted to the surround 14. A first registration surface 16, is positioned such that the flat 20 of the wafer 12 is abutted against the flat 22 of the surface 16. A second registration surface 18 is positioned to provide a point contact 24 with the wafer 12 at an angle of about 90° from the wafer flat 20. A third, adjustable registration surface 26 is positioned to to provide a point contact 28 with the wafer 12 at an angle of about −120° from the wafer flat 20.

The third registration surface 26 is adjustable through a pair of guides 30 that are fixedly mounted to a separate surround base 32. This third registration surface 26 is loaded against the wafer 12 at a point 28 by means of a pair of metal wire flexures 34 that provide the surface 26 with a springloaded force. A first end of each metal wire flexure 34 is bonded to the third registration surface 26 and a second end of each metal wire flexure 34 is bonded to an anchor block 36 that is fixedly mounted to the separate surround base 32. It should be noted that the surround 14, the three registration surfaces 16, 18, 26, the guides 30, the anchor block 36, and the separate surround base 32 are all made of the same material as the wafer to maintain a consistent reaction during a thinning or etching process.

The surround 14 is registered to an aluminum or stainless steel holding plate 38, or platen, by means of a pair of pins 40, 42, that protrude from the platen 38. A first pin 42 is matched with a hole 44 in the center of the surround 14. A second pin 40 is aligned with a notch 46 in the diameter of the surround 14. The notch 46 allows for thermal expansion of the surround 14 during processing. It should be noted that the platen 38 is mounted to a movable or a stationary stage such that the entire apparatus 10, including the wafer 12, can be progressively moved with respect to a stationary thinning or etching process instrument probe or vice-versa, respectively.

Although not required for wafer registration purposes, a sacrificial parking pad 48 is shown mounted to the surround 14. This parking pad 48 provides a surface upon which a thinning or etching process instrument probe may be initialized such that no damage is done to the wafer 12 or the surround 14. As with the other components of the apparatus 10, the sacrificial parking pad 48 is made of the same material as the wafer 12.

The above described apparatus 10 is used to register a wafer 12 in a metrology instrument. Such a metrology instrument generates, among other types of data, a map that indicates a thickness of the outermost layer of the wafer 12 surface. The wafer 12 is then registered to an identical apparatus 10 in a thinning or etching instrument. The thinning or etching instrument processes the surface of the wafer 12 to a desired thickness consistency or shape, respectively. The identical registration apparatuses 10 used in both the metrology and thinning or etching instruments ensure an accurate correlation between the outer layer thickness map data and the thinning or etching process, respectively. Of course, the apparatuses 10 must be initially calibrated to their respective instruments.

It is thus seen that the objectives set forth above are efficiently attained and, since certain changes may be made in the above described apparatus without departing from the scope of the invention, it is intended that all matter contained in the above description or shown in the accompanying drawing shall be interpreted as illustrative and not in a limiting sense.

What is claimed is:

1. An apparatus for providing a consistent registration of a semiconductor wafer undergoing interdependent process steps in a plurality of different processing instruments, said apparatus comprising:
   means for providing a support upon which said semiconductor wafer is registered;
   means for providing a registration to a flat of said semiconductor wafer;
   means for providing a registration to a first point along a circumference of said semiconductor wafer; and
   means for providing a registration to a second point along said semiconductor wafer circumference, such that said semiconductor wafer is forced against said flat registration means and said first point registration means by a force provided by said second point registration means, said second point registration means being adjustable to accommodate diameter variations between successively processed semiconductor wafers.

2. An apparatus as described in claim 1, wherein said means for providing a support for said semiconductor wafer comprises:
   a platen that is mounted to each of said plurality of process instruments; and
   a surround wafer that is registered to said platen.

3. An apparatus as described in claim 2, wherein said platen is mounted to a movable stage in ones of said plurality of process instruments, and wherein said platen is mounted to a stationary stage in others of said plurality of process instruments.

4. An apparatus as described in claim 3, wherein said movable stage moves in accordance with said work in said ones of said plurality of process instruments, and wherein said stationary stage maintains a fixed position with respect to said others of said plurality of process instruments.

5. An apparatus as described in claim 4, wherein said platen material is selected from a group of materials consisting of aluminum and stainless steel.

6. An apparatus as described in claim 2, wherein a plurality of pins protrude from a surface of said platen, and wherein a like plurality of recesses are formed in said surround wafer to correspond with said pins such that said surround wafer is registered to said platen by aligning said plurality of pins with said plurality of recesses.

7. An apparatus as described in claim 6, wherein ones of said plurality of surround wafer recesses are formed as notches along a circumference of said surround wafer, and wherein others of said plurality of surround wafer recesses are formed as holes through a surface of said surround wafer.

8. An apparatus as described in claim 7, wherein said platen surface has two pins, and wherein said surround wafer has one notch and one hole to correspond with said pins such that said surround wafer is registered to said platen by aligning a first of said pins with said notch and a second of said pins with said hole.

9. An apparatus as described in claim 2, wherein said flat registration means and said first point registration means are fixedly mounted to a surface of said surround wafer, and wherein said semiconductor wafer is placed on said surface of said surround wafer and registered to said flat registration means and to said first point registration means.

10. An apparatus as described in claim 9, wherein said surround wafer is made of like material as said semiconductor wafer, whereby a consistent reaction during said work in said plurality of process instruments is maintained.

11. An apparatus as described in claim 1, wherein said means for providing a registration to a flat of said semiconductor wafer is a registration surface that is abutted against said flat of said semiconductor wafer, and wherein said flat registration means is fixedly mounted on said semiconductor wafer support means.

12. An apparatus as described in claim 11, wherein said flat registration surface is made of like material as said semiconductor wafer, whereby a consistent reaction during said work in said plurality of process instruments is maintained.

13. An apparatus as described in claim 1, wherein said means for providing a registration to a first point along said semiconductor wafer circumference is a registration surface that is abutted against a first point on said circumference of said semiconductor wafer, and wherein said first point registration means is fixedly mounted on said semiconductor wafer support means.

14. An apparatus as descibed in claim 13, wherein said flat registration surface is made of like material as said semiconductor wafer, whereby a consistent reaction during said work in said plurality of process instruments is maintained.

15. An apparatus as described in claim 14, wherein said first point along said semiconductor wafer circumference is about 90° from said semiconductor wafer flat.

16. An apparatus as described in claim 1, wherein said means for providing a registration to a second point along said semiconductor wafer circumference is a registration surface that is abutted against a second point on said circumference of said semiconductor wafer, and wherein said second point registration means is adjustable to accommodate for a diameter variation between successively processed semiconductor wafers.

17. An apparatus as described in claim 16, further comprising a plurality of guides and a plurality of metal wire flexures, wherein said adjustable registration surface is adjustable through said plurality of guides, and wherein said adjustable registration surface is forcibly abutted against said second wafer circumference point by said plurality of metal wire flexures.

18. An apparatus as described in claim 17, wherein said adjustable registration surface is adjustable through two guides, and wherein said adjustable registration surface is forced by two metal wire flexures.

19. An apparatus as described in claim 18, further comprising an anchor block, wherein a first end of both of said metal wire flexures are bonded to said adjustable registration surface, and wherein a second end of both of said metal wire flexures are bonded to said anchor block.

20. An apparatus as described in claim 19, further comprising a surround base, wherein said guides and said anchor block are fixedly mounted on said surround base, and wherein said surround base is registered to each of said plurality of process instruments.

21. An apparatus as described in claim 20, wherein said adjustable registration surface, said guides, said anchor block, and said surround base are all made of like materials as said semiconductor wafer, whereby a consistent reaction during said work in said plurality of process instruments is maintained.

22. An apparatus as described in claim 21, wherein said second wafer circumference point is $-120°$ from said semiconductor wafer flat.

* * * * *